(12) United States Patent
Krah et al.

(10) Patent No.: US 6,583,676 B2
(45) Date of Patent: Jun. 24, 2003

(54) PROXIMITY/TOUCH DETECTOR AND CALIBRATION CIRCUIT

(75) Inventors: Christoph H. Krah, San Jose, CA (US); Richard D. Cappels, Mesa, AZ (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 09/886,237

(22) Filed: Jun. 20, 2001

(65) Prior Publication Data

US 2002/0196066 A1 Dec. 26, 2002

(51) Int. Cl.[7] .................................................. H03B 1/00
(52) U.S. Cl. ........................... 331/74; 331/65; 345/174
(58) Field of Search ................... 331/65, 74; 178/18.06, 178/19.03; 345/174, 862

(56) References Cited

U.S. PATENT DOCUMENTS

| | | | |
|---|---|---|---|
| 4,550,221 A | * 10/1985 | Mabusth | 178/18 |
| 5,283,559 A | 2/1994 | Kalendra et al. | |
| 5,469,364 A | * 11/1995 | Hughey et al. | 702/65 |
| 5,790,107 A | * 8/1998 | Kasser et al. | 345/174 |

FOREIGN PATENT DOCUMENTS

| | | |
|---|---|---|
| EP | 0478856 A1 | 4/1992 |
| EP | 0954098 A2 | 11/1999 |
| EP | 0996228 A1 | 4/2000 |

OTHER PUBLICATIONS

PCT International Search Report for PCT Int'l Appln No. US02/19601, mailed Sep. 17, 2002 (6 pgs).

* cited by examiner

*Primary Examiner*—Tuan T. Lam
*Assistant Examiner*—Hiep Nguyen
(74) *Attorney, Agent, or Firm*—Blakely, Sokoloff, Taylor & Zafman LLP

(57) ABSTRACT

A calibration circuit and method for a proximity/touch detector allow automatic calibration to the proximity/touch detector components, chassis affects, and ambient conditions such that initial factory calibration and periodic manual calibration are not needed. The calibration circuit switches a capacitance into the input capacitance of a Schmitt trigger free running oscillator to change the output frequency of the oscillator. A capacitive sensor forms part of the input capacitance. The change in frequency simulates the frequency shift associated with the difference in input capacitance generated when an object, such as a finger, is touching the capacitive sensor and when the capacitive sensor is free from contact with the object.

9 Claims, 4 Drawing Sheets

PROXIMITY/TOUCH DETECTOR AND CALIBRATION CIRCUIT

BACKGROUND OF THE INVENTION

1. Field of the Invention

The present invention is related to calibration circuits and, in particular to calibration of proximity and touch detectors.

2. Background Information

Touch detectors have been in use for some time to indicate a condition where there is contact between the detector and some other solid object. Any well-known electromechanical "on/off" switch can be used in a touch detector. Proximity detectors also have been used for some time to indicate when one object is close to another object and to measure how far away one object is from the detector.

"Capacitive" sensors often are used in proximity detectors and in touch detectors because electromechanical limit switches tend to break or malfunction over time from use. Capacitive touch sensors translate effective capacitance to a binary signal, whose state determines whether that effective capacitance has been exceeded. The effective capacitance relates to a distance between an object and a sensor plate. This distance may be separated by a dielectric, such as a polycarbonate.

There are a variety of well-known ways of measuring capacitance between two objects. One way is to use an oscillator in which the unknown capacitor at the input of the oscillator is charged and discharged between two distinct thresholds. When the voltage input to the oscillator reaches one threshold value, the output of the oscillator switches to a low value. When the voltage input to the oscillator reaches the other threshold value, the output of the oscillator switches to a high value. The frequency of the oscillator is dependent on the magnitude of the unknown capacitance, i.e., dependent on how fast the unknown capacitor is charged and discharged.

Proximity detectors require frequent calibration to compensate for component aging, temperature variations, power supply deviations, and other environmental changes. Manual calibration or factory calibration should not be necessary as they are time consuming and costly. What is needed, therefore, is a touch sensor that is capable of calibrating itself automatically and periodically.

SUMMARY

Presented herein is a circuit and method to calibrate a proximity/touch detector. One aspect of the present invention distinguishes between an object, such as a finger, almost touching a front panel of a computer and the object actually touching the front panel. The present invention modifies (switches in) input capacitance to establish a quiescent operating point for an oscillator, where the change in output frequency is proportional to the change in input capacitance that would result from a front panel being touched from a condition of being free from contact.

An advantage of this and other aspects of the present invention is that initial factory calibration and periodic manual calibration are not needed. Other features and advantages as well as the structure and operation of various embodiments are described in detail below.

BRIEF DESCRIPTION OF THE DRAWINGS

The invention is best understood by reference to the figures wherein references with like reference numbers generally indicate identical, functionally similar, and/or structurally similar elements. The drawing in which an element first appears is indicated by the leftmost digit(s) in the reference number in which.

DETAILED DESCRIPTION

A calibration circuit and method for a proximity/touch detector is described herein. In the following description, various aspects of the invention are described. However, it will be apparent to those skilled in the art that the invention may be practiced with only some or all aspects of the invention. For purposes of explanation, specific numbers, methods, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Some parts of the description will be presented using terms such as particular currents, voltages (or potentials), types of transistors, and so forth, commonly employed by those skilled in the art to convey the substance of their work to others skilled in the art. Other parts of the description will be described as multiple discrete steps performed in turn in a manner that is most helpful in understanding the invention. However, the order in which they are described should not be construed to imply that these operations are necessarily order dependent or that the operations be performed in the order in which the steps are presented.

The invention is described below in further detail with respect to several examples for illustration. Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
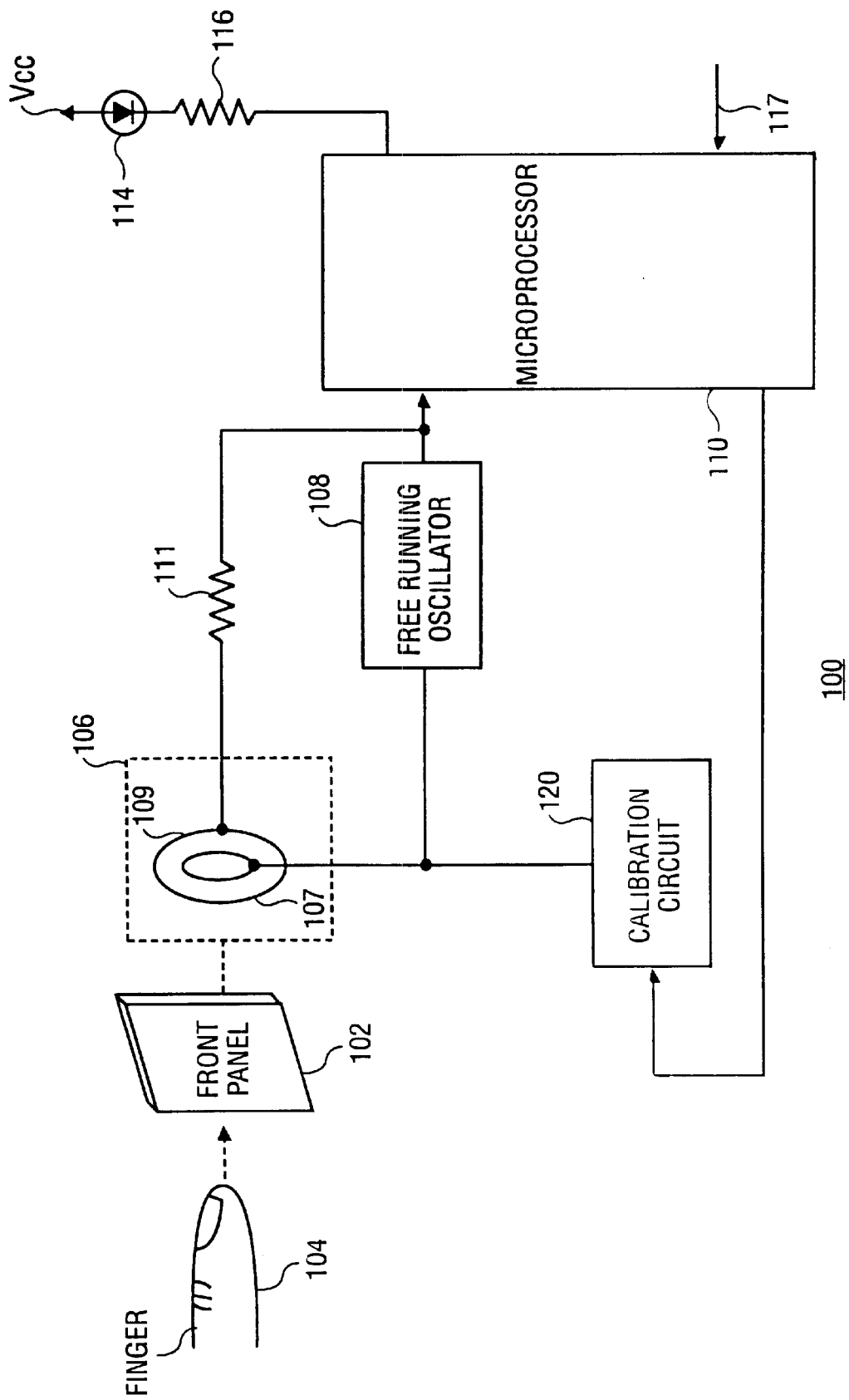
FIG. 1 is a block diagram of a proximity/touch detector suitable for implementing aspects of the invention.

FIG. 1 is a simplified schematic diagram of an appliance 100 suitable for implementing aspects of the present invention. In one embodiment, the appliance 100 is a Macintosh G4 Cube computer available from Apple Computer Corporation.

The appliance 100 includes a front panel 102 made from a dielectric, such as polycorbonate. Typically, the front panel 102 includes a desktop liquid crystal display (LCD). In the embodiment where the appliance 100 is a G4 Cube, the front panel does not have a desktop LCD. Instead the LCD is separate from the G4 Cube. To turn the appliance 100 "on," a user contacts the front panel 102, using a finger 104, for example. Of course, the finger 104 is not part of the appliance 100, although depicted for purposes of explanation.

When the finger 104 contacts the front panel 102, a sensing electrode 106 detects the contact. The sensing electrode 106 is part of a capacitive sensor and typically has a guard 107 and sensing plate 109. The guard 107 reduces the stray capacitance between the sensing plate 109 and the appliance 100's chassis. The sensing plate 109 is the sensing portion of the sensing electrode 106.

When a grounded object, which also has a free air capacitance, is brought closer to the sensing electrode 106, the capacitance of the sensing plate 109 increases. This is because of well-known properties of capacitance where capacitances in parallel are additive such that placing a ten picoFarad (or $10^{-12}$ Farads or pF) capacitor in parallel with a twenty pF capacitor results in an equivalent thirty pF total capacitance. Conversely, capacitances in series have an inverse relationship such that placing a ten pF capacitor in series with a twenty pF capacitor results in an equivalent 6.67 pF total capacitance.

Moreover, all objects have a free air capacitance when measured with reference to ground, which varies from object to object. The free air capacitance of a human body and therefore of the finger 104, for example, is approximately several hundred pF.

When an object approaches the sensing electrode 106, the capacitance between the object and the sensing electrode 106 increases, and the total capacitance of the sensing plate 109 to ground increases. If the finger 104 is five centimeters away from the sensing electrode 106, for example, the capacitance between the finger and the sensing electrode 106 may be in the range of femtoFarads (or $10^{-15}$ Farads).

Similarly, when an object such as the finger 104 approaches the sensing electrode 106, the object reduces the capacitive coupling between the plate 109 and the guard 107. As a result, a part of the capacitance is transferred from the feedback path of the oscillator 108 to the oscillator 108's input and part of that capacitance is transferred to the output of the oscillator 108 via the guard resistor 111. This process is called capacitive transfer. Both the reduction in feedback coupling capacitance and the increase in input capacitance contribute to the reduction of the frequency of the free running oscillator 108.

The sensing electrode 106's capacitance is translated to the frequency domain by loading a free running oscillator 108 with the sensing electrode 106's capacitance. The oscillator 108 performs its conventional functions of generating an output frequency based on its input capacitance and feedback impedance. The feedback impedance is comprised of the series combination of the guard resistor 111 and the coupling capacitance between the guard 107 and the plate 109.

The oscillator 108 also feels the change in the sensing electrode 106's capacitance from the capacitance value associated with the condition where the front panel 102 is not being contacted to the capacitance value associated with the condition where the front panel 102 is being contacted. When the oscillator 108 sees the change in the sensing electrode 106's capacitance, the oscillator 108 will change its output frequency accordingly. For example, the oscillator 108 generates one frequency when the front panel 102 is not being contacted and another frequency when the front panel 102 is being contacted.

The oscillator 108 couples its output frequency to a microprocessor 110. The combination of the front panel 102, the sensing electrode 106, the oscillator 108, and the microprocessor 110 measures the proximity of an object to the front panel 102. In one embodiment, as an object approaches the front panel 102, a light emitting diode (LED) 114 begins to glow. A resistor 116 limits the current through the LED 114. As the object gets closer to the front panel 102, the LED 114 glows brighter. The increasing brightness of the LED 114 provides continuous feedback to a user/object. When the object contacts the front panel 102, the LED 114 flashes and the appliance 100 is activated via a binary control signal 117.

To calibrate the applicance 100, in one embodiment, an output frequency is associated with the condition where the front panel 102 is not being contacted and another output frequency is associated with the condition where the front panel 102 is being contacted. The microprocessor 110 compares the two output frequencies to measure the frequency shift from the output frequency associated with the condition where the front panel 102 is not being contacted and the output frequency associated with the condition where the front panel 102 is being contacted. Microprocessor 110 logic may be hardwired logic, including didgital gates or firmware.

For purposes of explanation, assume that there is a three hundred Hertz (Hz) frequency shift. This value is hard coded into the microprocessor 110. The microprocessor can then make a decision that whenever a three hundred Hz frequency shift appears on its input from the oscillator 108 the microprocessor 110 will interpret this frequency shift a condition where some object, such as the finger 104, is touching the front panel 102.

One limitation of this solution is that hard-coding the three hundred Hz frequency shift into the microprocessor 110 does not take into account that the performance of oscillators varies from circuit to circuit because the performance of devices making up the oscillators varies from device to device.

For example, a suitable oscillator typically has a well-known Schmitt trigger, which has two threshold voltages. The Schmitt trigger output switches back and forth (or oscillates) between the two threshold voltages at a given frequency. The limitation comes into play when, because the devices were made at two different fabrication plants, for example, one Schmitt trigger switches back and forth at one frequency while another Schmitt trigger switches back and forth at different frequency. The frequency will be higher for a Schmitt trigger whose distance between threshold voltages is smaller than the distance between threshold voltages of another Schmitt trigger.

As a consequence of this limitation, microprocessors have to be matched with Schmitt triggers for proper interpretation of the frequency. This is undesirable because it is less efficient, less cost effective, and more cumbersome to have to match components in every circuit, especially considering that there may be several million of each component manufactured each year. Moreover, in addition to its own component values, every appliance has chassis affects, which are variations in operation caused by proximity to the chassis in which the circuitry is mounted. Each appliance also is affected by ambient conditions.

An aspect of the present invention automatically calibrates the appliance 100, to take into consideration the variations among components, for example. A calibration circuit 120 calibrates the appliance 100 to its own component values. An advantage of the calibration circuit 120 is that the microprocessor 120 does not have to be matched to the oscillator 108 beforehand. Moreover, using the calibration circuit 120, initial factory calibration and periodic manual calibrations are unnecessary.

In one embodiment, the calibration circuit 120 modifies the input capacitance to the oscillator 108 to establish a quiescent operating point for the oscillator 108. The change in oscillator 108 output frequency is proportional to the change in input capacitance from the capacitance value associated with the condition where the front panel 102 is not being contacted to the capacitance value associated with the condition where the front panel 102 is being contacted.

More specifically, the calibration circuit 120 uses a switch to change the input capacitance to a Schmitt trigger which changes the output frequency of the Schmitt trigger. In one embodiment, the switch changes the input capacitance such that the frequency out of the Schmitt trigger switches from being approximately equal to the frequency generated when the finger 104 is not touching the front panel 102 to being approximately equal to the frequency generated when the finger 104 is touching the front panel 102.

Figure 2:
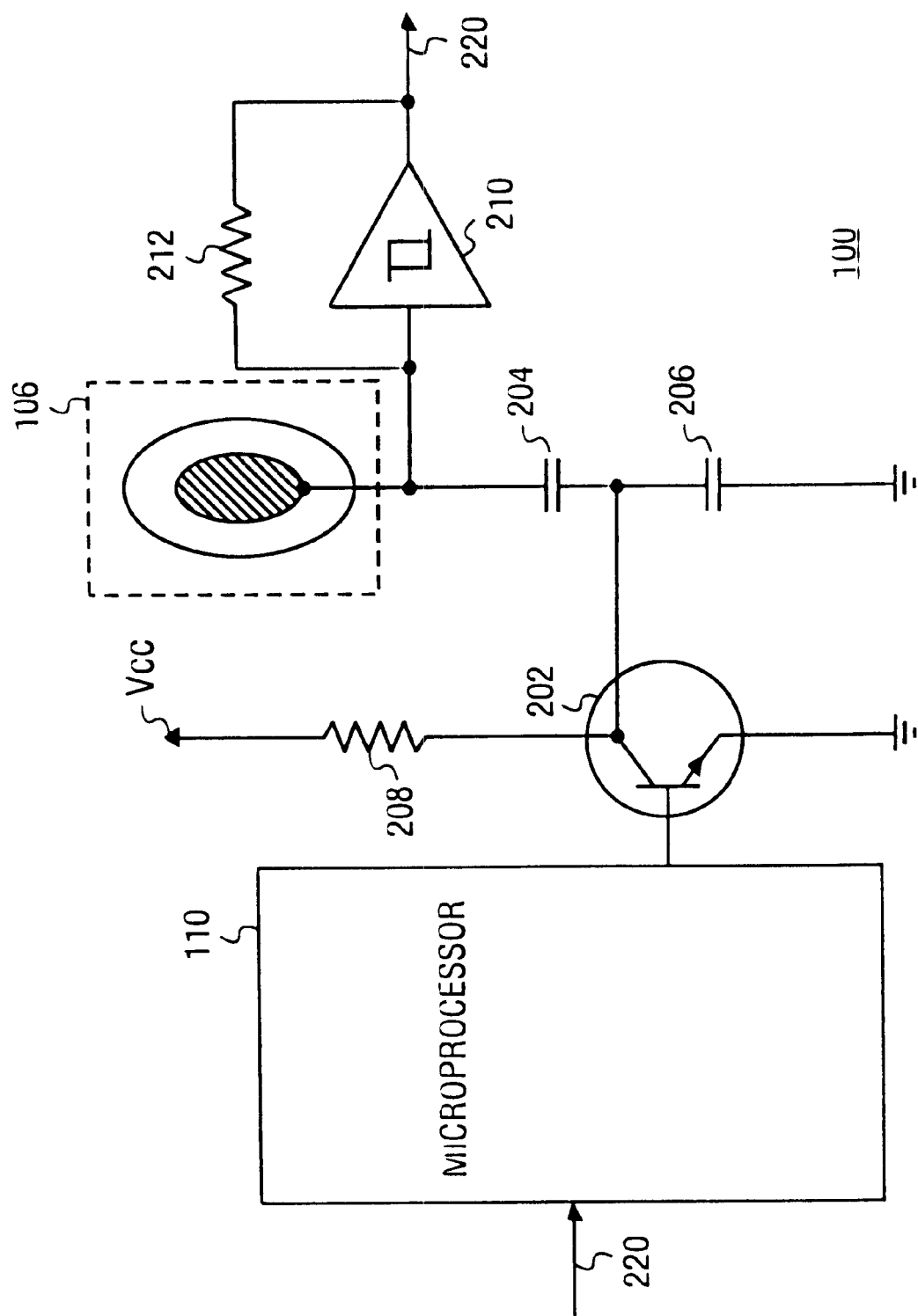
FIG. 2 is a schematic diagram of the calibration circuit of FIG. 1.

FIG. 2 is a schematic diagram of the appliance 100 showing the calibration circuit 120 and the oscillator 108 in more detail. The calibration circuit 120 includes a transistor 202, a capacitor 204, a capacitor 206, and a collector resistor 208. The oscillator 108 includes a Schmitt trigger 210 and a feedback resistor 212. The output 220 of the Schmitt trigger 210 is provided as an input to the microprocessor 110.

The capacitor 204, the capacitor 206, and the sensing electrode 106 are in series. As such, the combination of the capacitor 204, the capacitor 206, and the sensing electrode 106 generate an input capacitance for the oscillator 108. The collector resistor 208 is coupled between the collector of the transistor 202 and Vcc.

In one embodiment, the microprocessor 110 measures the frequency out of the Schmitt trigger 210 with the transistor 202 turned "off." The transistor 202 being turned "off" simulates an input capacitance associated with a finger not touching the front panel 102. In effect, the microprocessor 110 is measuring the effective capacitance of the capacitor 204 in series with the parallel combination of the collector to emitter capacitance of the transistor 202 and the capacitor 206.

The microprocessor 110 then turns the transistor 202 "on," which shorts the capacitor 206. Turning on the transistor 202 simulates a reduction in input capacitance that would accompany a finger touching the front panel 102.

The microprocessor 110 then measures the frequency output of the Schmitt trigger 210 with the transistor 202 turned "on." In effect, the microprocessor 110 is measuring the effective capacitance of the capacitor 204 in series with the impedance of the transistor 202.

The microprocessor 110 compares the two frequencies to measure the frequency shift. In one embodiment, the frequency output of the Schmitt trigger 210 when a finger is touching the front panel 102 is lower than the frequency output of the Schmitt trigger 210 when a finger is not touching the front panel 102.

The microprocessor 110 then makes a decision that whenever it sees a this particular frequency shift when the microprocessor 110 is not switching the transistor 202 "on" or "off," the microprocessor 110 interprets this frequency shift as going from a condition of an object not contacting the front panel 102 to a condition of an object in contact with the front panel 102.

The capacitors 204 and 206 are chosen such that the capacitance of the capacitor 206 is much greater than the junction capacitances of the transistor 202. The capacitance of the capacitor 206 depends on the thickness and material of the front panel 102. The capacitance of the capacitor 206 is equal to or larger than the capacitance of the capacitor 204 such that the total series capacitance of the capacitors 204 and 206 may range between one-half the capacitance of the capacitor 204 and the capacitance of the capacitor 206 when the transistor 202 is open (or turned "off"). It is important to make the capacitor 206 larger than transistor 202's collector to emitter capacitance to diminish the effect of the transistor 202's collector to emitter capacitance in respect to the total capacitance at the input node of the Schmitt trigger 210 when the transistor 202 is turned off. In addition, the collector resistor 208 promotes the reduction of the transistor 202's collector to emitter capacitance by pulling the transistor 202's collector up to Vcc when the transistor 202 is turned off.

If the object being sensed, such as the finger 104, is an infinite distance from the sensing electrode 106 and the transistor 202 is open (or turned "off"), the frequency output of the Schmitt trigger 210 it at its highest point because the series capacitance of the capacitors 204 and 206 is now smaller than the capacitance of the capacitor 204. When the transistor 202 is turned on, which is equivalent to a finger 104 touching the front panel 102, the capacitor 206 gets shorted to ground and now the capacitor 204 solely determines the capacitance at the input of Schmitt trigger 210.

The free running frequency of the Schmitt trigger 210 is determined by the capacitor 204. Because the capacitance of the capacitor 204 is bigger than the capacitance of the capacitors 204 and 206 in series, the Schmitt trigger 210 output frequency is at its lowest point. The differential between the output frequency is at its lowest point and the output frequency is at its highest point is referred to as the frequency range of the oscillator 108.

Figure 3:
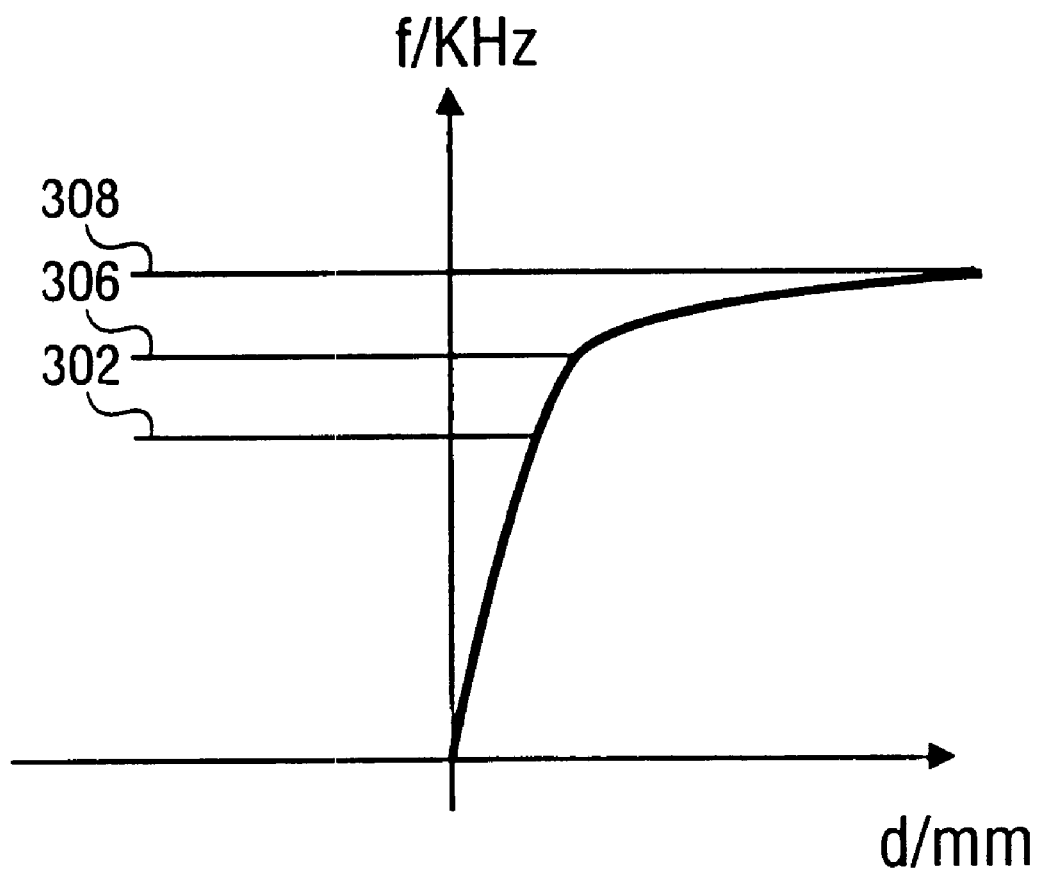
FIG. 3 is a graphical representation of the frequency range function of the oscillator of FIG. 1.

FIG. 3 is a graphical representation 300 of a frequency range function for the oscillator 108. The "y" axis represents frequency output of the oscillator 108. The "x" axis represents the distance of an object from the front panel 102, in millimeters. A portion 302 represents the output frequency of the oscillator 108 at its lowest point. A portion 308 represents the output frequency of the oscillator 108 at its highest point. The range on the "y" axis ranging from 302 to 308 is called the frequency of the oscillator, which represents the oscillator 108's frequency range that is scanned when the user moves a finger 104 from an infinite distance close to the sensing electrode 106 effectively making contact with the front panel 102. The frequency of the oscillator is inversely proportional to the capacitance at the input of the Schmitt trigger 210 and is determined with the formula $$f = 1/\{(z)(R)(C_{(d)})\}$$

where f is the frequency of the oscillator, z is a constant that depends on the two thresholds of the Schmitt trigger oscillator and the supply voltage, R the feedback impedance 212 and C the capacitance of the input node of the oscillator, $C_{(d)}$ is inversely proportional to the distance between finger 104 and sensing electrode 106 and if offset by the calibration capacitance comprised of the capacitors 204 and 206. Therefore, the oscillator 108's frequency is linearly proportional to the distance between the sensing object, such as the finger 104, and the sensing electrode 106 in the far field (i.e., the finger 104 is not touching the front panel).

Figure 4:
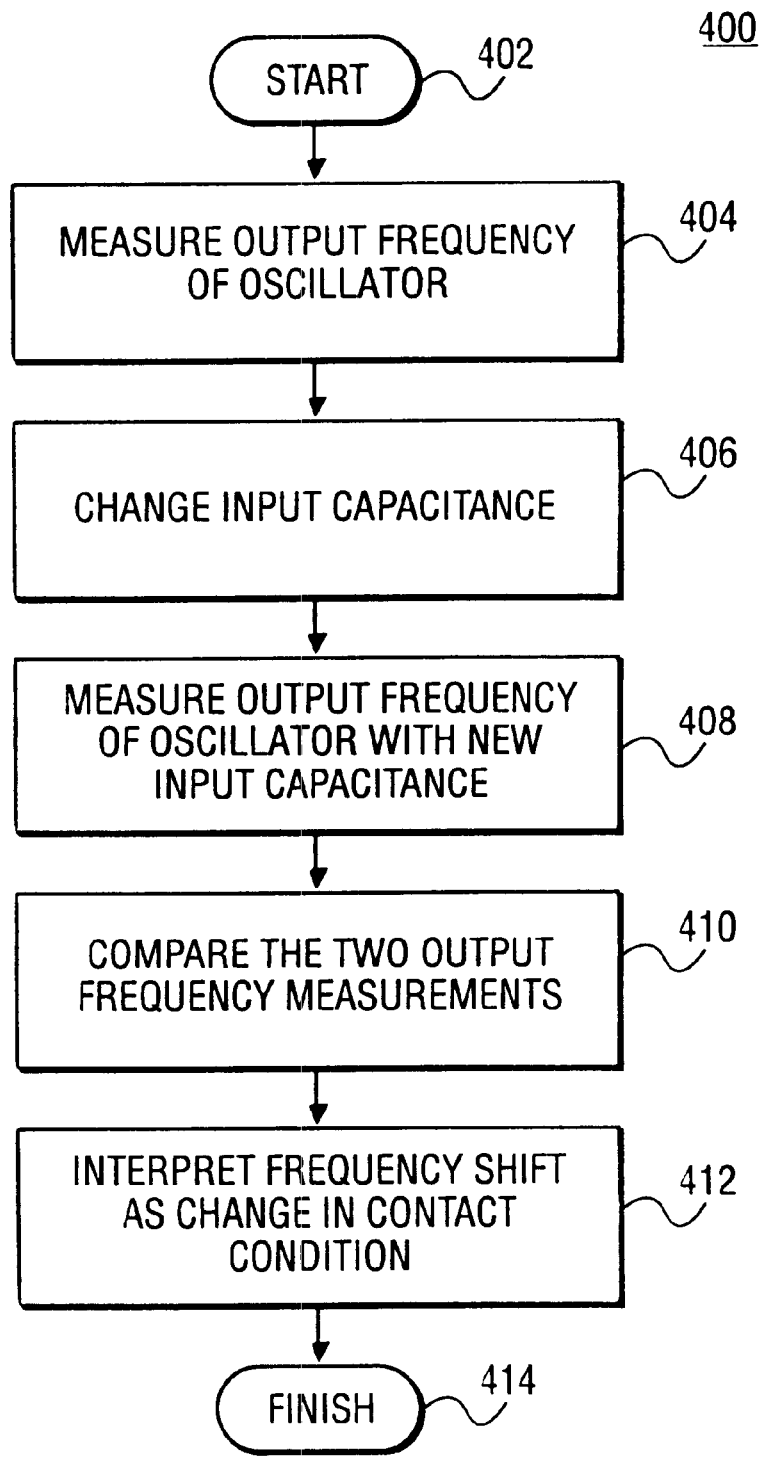
FIG. 4 is a flow chart of a method performed using the calibration circuit of FIG. 1.

FIG. 4 is a flow chart illustrating method 400 of an approach to modifying the input capacitance of an oscillator to simulate the change in capacitance (or a differential input capacitance) associated an object is in contact with a capacitive sensor and the capacitive sensor is free from contact with an object. The method 400 begins with step 402, wherein control immediately passes to step 404. Step 404 measures the output frequency of an oscillator. The oscillator has an input capacitance substantially equivalent to the capacitance of a capacitive sensor (or sensing electrode) coupled to it.

Step 406 changes the input capacitance. The change in input capacitance is proportional to a change in input capacitance that would result from a capacitive sensor in an appliance being contacted and not contacted. Step 408 measures the output frequency of the oscillator with the changed input capacitance. Step 410 compares the two output frequencies of the oscillator and determines a frequency shift associated with the change in input capacitance that would result from the capacitive sensor in the appliance being contacted and not contacted. Step 412 determines that this frequency shift represents going from a condition of the capacitive sensor being free from contact to a condition of the capacitive sensor being contacted by an object. The method 400 finishes in step 414.

Aspects of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.) that include computer readable program code embodied in a computer usable medium to cause a computer to perform functions herein.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A calibration circuit, comprising:

a transistor and a first capacitor coupled to each other;

a second capacitor coupled in series with the first capacitor and the transistor;

a capacitive sensor coupled in series with the second capacitor, the first capacitor and the transistor;

an oscillator coupled to the capacitive sensor and the second capacitor; and a microprocessor coupled to turn the transistor "on" to decrease an actual input capacitance to the oscillator to simulate an input capacitance associated with an object not being in contact with the capacitive sensor or to turn the transistor "off" to increase an actual input capacitance to the oscillator to simulate an input capacitance associated with an object being in contact with the capacitive sensor.

2. The calibration circuit of claim 1 wherein the microprocessor is coupled to an output of the oscillator to measure the frequency output of the oscillator when the transistor is turned "on."

3. The calibration circuit of claim 1 wherein the microprocessor to selectively compare the frequency output of the oscillator when the transistor is turned "on" to the frequency output of the oscillator when the transistor is turned "off."

4. The calibration circuit of claim 1 wherein the microprocessor selectively to measure a frequency shift associated with the frequency output of the oscillator when the transistor is turned "on" and the frequency output of the oscillator when the transistor is turned "off."

5. The calibration circuit of claim 1 wherein the microprocessor to selectively determine that a frequency shift associated with the frequency output of the oscillator when the transistor is turned "on" and the frequency output of the oscillator when the transistor is turned "off" as going from a condition of the capacitive sensor being free from contact to a condition of the an object being in contact with the capacitive sensor.

6. The calibration circuit of claim 1, wherein the oscillator comprises:

a Schmitt trigger; and a feedback resistor coupled from an output of the Schmitt trigger to an input of the Schmitt trigger.

7. The apparatus of claim 1, further comprising a resistor coupled between the collector of the transistor and a supply voltage.

8. The calibration circuit of claim 1, further comprising a resistor coupled between the collector of the transistor and a supply voltage to reduce the capacitance at the collector when the transistor is turned "off."

9. The calibration circuit of claim 1, further comprising a resistor coupled between the collector of the transistor and a supply voltage to modify the impedance seen by the oscillator when the transistor is turned "off."

* * * * *